(12) United States Patent
Bijlenga et al.

(10) Patent No.: US 6,738,258 B2
(45) Date of Patent: May 18, 2004

(54) POWER SEMICONDUCTOR MODULE

(75) Inventors: Bo Bijlenga, Amal (SE); Fabian Zwick, Suhr (CH); Stefan Linder, Zofingen (CH); Patrick Erne, Elsau (CH)

(73) Assignee: ABB Research LTD, Zurich (CH)

( * ) Notice: Subject to any disclaimer, the term of this patent is extended or adjusted under 35 U.S.C. 154(b) by 0 days.

(21) Appl. No.: 10/302,824

(22) Filed: Nov. 25, 2002

(65) Prior Publication Data

US 2003/0107875 A1 Jun. 12, 2003

(30) Foreign Application Priority Data

Dec. 6, 2001 (EP) .............................. 01811188

(51) Int. Cl.$^7$ ................................ H05K 7/20
(52) U.S. Cl. ...................... 361/704; 257/707; 257/713; 257/678; 257/686; 257/691; 257/692; 257/687; 257/718; 257/719; 257/726; 361/707; 361/710; 361/714; 361/715; 361/716
(58) Field of Search ................... 257/706–707, 257/712–713, 723, 678–679, 683, 686–687, 691–692, 718–719, 726–727; 361/704–710, 714–722; 363/141, 144

(56) References Cited

U.S. PATENT DOCUMENTS

| 3,183,407 | A | | 5/1965 | Yasuda et al. |
| 4,047,197 | A | | 9/1977 | Schierz |
| 4,853,762 | A | | 8/1989 | Ewer et al. |
| 4,965,710 | A | * | 10/1990 | Pelly et al. ................. 363/141 |
| 5,031,069 | A | * | 7/1991 | Anderson .................... 361/707 |
| 5,625,536 | A | * | 4/1997 | Soyano et al. .............. 361/719 |
| 5,747,875 | A | * | 5/1998 | Oshima ....................... 257/687 |
| 5,920,119 | A | * | 7/1999 | Tamba et al. ............... 257/718 |
| 5,982,031 | A | * | 11/1999 | Stockmeier ................. 257/723 |
| 6,272,015 | B1 | * | 8/2001 | Mangtani .................... 361/707 |

FOREIGN PATENT DOCUMENTS

| EP | 0762496 A2 | 3/1997 |
| EP | 0923127 A2 | 6/1999 |
| WO | WO98/12748 | 3/1998 |

* cited by examiner

*Primary Examiner*—Gregory D Thompson
(74) *Attorney, Agent, or Firm*—Burns, Doane, Swecker & Mathis, L.L.P.

(57) ABSTRACT

The power semiconductor module (1) comprises a housing (5), a covering panel (11) and at least two submodules (21, 22). The submodules (21, 22) each comprise at least one semiconductor chip, which has two main electrodes which are electrically conductively connected to main connections (3, 4) of the submodules. The submodules (21, 22) are arranged alongside one another, and one of their two main surfaces is pressed against the covering panel (11) of the module. The submodules are electrically connected in series. The maximun blocking voltage of the module is doubled by connecting the submodules, which are arranged alongside one another, in series. This reduces the length and the costs of the stack for hihg-voltage switch since fewer components are required for the same blocking voltages, in particular fewer modules and cooling elements.

17 Claims, 3 Drawing Sheets

POWER SEMICONDUCTOR MODULE

FIELD OF THE INVENTION

The invention relates to the field of power electronics. It relates in particular to a power semiconductor module as claimed in the precharacterizing clause of patent claim 1.

BACKGROUND OF THE INVENTION

For high-power applications, power semiconductor modules are manufactured using press pack module technology. These press pack modules are used as high-power switches for currents of up to several thousand amperes in the high-voltage range up to 1000 kV. Since insulated gate bipolar transistors (IGBT), as are used nowadays in a press pack module, can withstand a voltage of only around a few thousand volts, a number of press pack modules are connected in series in at least one stack for a high-voltage switch. The stack, with up to several dozen press pack modules, is compressed with a force of around 100 kN.

A conventional press pack module, such as that described in EP 762,496, generally has a number of semiconductor chips which are arranged alongside one another and are mounted with a first main electrode on a base plate. Second main electrodes of the semiconductor chips are made contact with by a number of contact dies. The base plate is connected to a first main connection, and the contact dies are connected to a second main connection. The main connections may be in the form of disks, and may be interconnected by means of flanges. The contact die has spring elements, by way of example, which press against the individual chips.

The individual semiconductor chips in the press pack module are formed into several groups and are combined in units, so-called submodules, which can be prefabricated. In this case, the semiconductor chips are connected in parallel with one another, for example with one IGBT and one diode chip together in one submodule.

A press pack module such as this is described in the attached European Patent Application with the Application Number 01810539.5, and is illustrated schematically in FIG. 1. The figure is split into two halves, with the left-hand half showing one half of the module in the preinstalled state, and the right-hand half showing the other half of the module, in the installed state in a stack of three modules.

The module with the three illustrated submodules 2 is in this case pressed against an electrically and thermally highly conductive base plate 12, which, by way of example, may be a cold plate through which a cooling liquid flows.

Even in the preinstalled state, the submodules 2, which are introduced into the insulating housing 5 from above, have a spring stress applied to them and are pressed against the covering panel 11, which is firmly connected to the insulating housing. The spring stress is produced by spring elements in the individual submodules, and is transmitted to the first main connections 3. The second main connections 4 project downward out of the insulating housing 5, in order to ensure reliable contact with the base plate 12.

In the installed state, the second main connections 4 of the submodules are pressed into the interior of the module housing by means of a contact force that is exerted on the base plate and the covering panel. In the process, the spring elements are compressed, so that the contact force acting on the electrodes of the semiconductor chips in the interior of the submodules is increased. The insulating housing in this case ensures that the spring elements are not compressed excessively, so that the contact force does not become too great.

A stack with press pack modules extends over a length of several meters. Complex precautions are necessary in order to allow the pressure mentioned above to be exerted over such a length. It is thus desirable to increase the maximum blocking voltage per unit length in a stack, in order to manage with fewer press pack modules for a given voltage.

The height of the stack, and hence the costs associated with it, could be reduced by increasing the blocking voltage of individual press pack modules. Unfortunately there is scarcely any prospect of raising the maximum blocking voltage, as mentioned above, of power semiconductor chips with present-day technology.

SUMMARY OF THE INVENTION

The object of the present invention is thus to provide a power semiconductor module of the type mentioned initially, which has a greater blocking voltage per physical height unit.

This object is achieved according to the invention by a power semiconductor module having the features of patent claim 1.

The power semiconductor module according to the invention has at least two submodules between two main electrical connections which are arranged on mutually opposite, essentially parallel, main surfaces of the module. The submodules have two main electrical connections which are arranged on in each case one of two mutually opposite, essentially parallel, main surfaces of the submodules. The submodules comprise in each case at least one semiconductor chip, which has two main electrodes, which are electrically conductively connected to the main connections of the submodule. The submodules are arranged alongside one another, and one of their two main surfaces is pressed against the covering panel. At least two submodules are electrically connected in series.

In comparison to conventional press pack modules, the blocking voltage can be doubled or increased by several times by connecting two or more submodules, which are arranged alongside one another, in series.

This reduces the length and the costs of a stack, since fewer components, in particular fewer cooling elements, are required for the same blocking voltages.

The physical height of the power semiconductor module according to the invention is only slightly greater than that of conventional press pack modules. However, the additional increase in size leads to the module being more mechanically robust, and this is particularly advantageous in long stacks, in particular.

It is also possible to use better semiconductor chips, with a lower blocking voltage, in comparison to conventional press pack modules, for the same or greater blocking voltages. Since semiconductor chips such as these, with half the blocking voltage, together produce fewer losses than an individual semiconductor chip with the full blocking voltage, it is also possible to reduce the losses in conventional stacks with the same dimensions, by using power semiconductor modules according to the invention.

In a first embodiment of the power semiconductor module, the first main connection of at least one first submodule is electrically conductively connected to the covering panel. A first electrically insulating layer is arranged between the second main connection of the at least one first submodule and that main surface of the module which is opposite the covering panel, and a second electrically insulating layer is arranged between the first main connection of at least one second submodule and the covering panel. The second main connection of the at least one second submodule is electrically conductively connected to the second main connection of the module. The second main connection of the at least one first submodule is electrically conductively connected to the first main connection of the at least one second submodule, via a connection.

The submodules are electrically connected in series, so that the blocking voltage of the power semiconductor module with IGBT semiconductors is doubled.

In a second embodiment of the power semiconductor module, a first electrically insulating layer is arranged between the first main connection of at least one first submodule and that main surface of the module which is opposite the covering panel. The first main connection of the at least one first submodule is electrically conductively connected to the covering panel via a first connection. A second electrically insulating layer is arranged between the second main connection of the at least one first submodule and the covering panel, as well as between the first main connection of at least one second submodule and the covering panel. The second main connection of the at least one second submodule is electrically conductively connected to the second main connection of the module. The second main connection of the at least one first submodule is electrically conductively connected to the first main connection of the at least one second submodule via a second connection.

With the same alignment in the module, the submodules are connected electrically in series, back-to-back. Using IGBT semiconductors, this results in a four-quadrant power semiconductor module which can be switched off and is used, by way of example, as an alternating-current switch in a matrix converter.

Further exemplary embodiments and advantages can be found in the corresponding dependent claims.

BRIEF DESCRIPTION OF THE DRAWINGS

The invention will be explained in more detail in the following text with reference to exemplary embodiments and in conjunction with the drawings, in which.

The reference symbols used in the drawings, and their meanings, are listed in summarized form in the list of reference symbols. In principle, identical parts are provided with the same reference symbols in the figures.

DETAILED DESCRIPTION OF THE INVENTION

Figure 2:
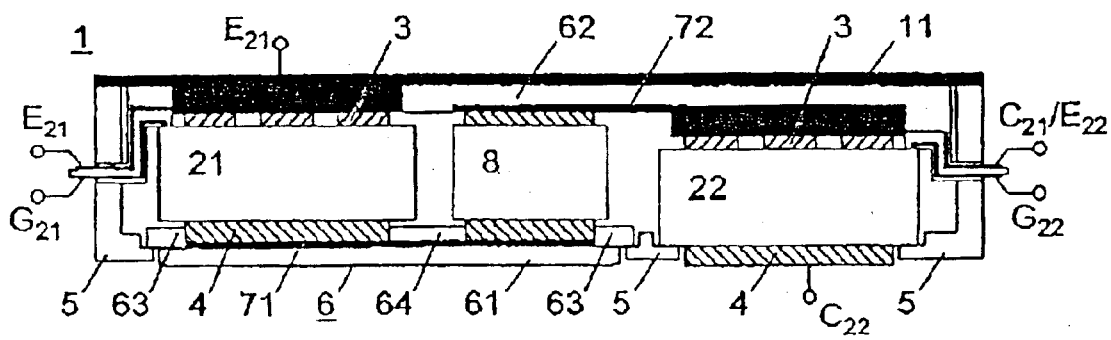
FIG. 2 shows a section through a first embodiment of a power semiconductor module according to the invention with two series-connected submodules.
Figure 3:
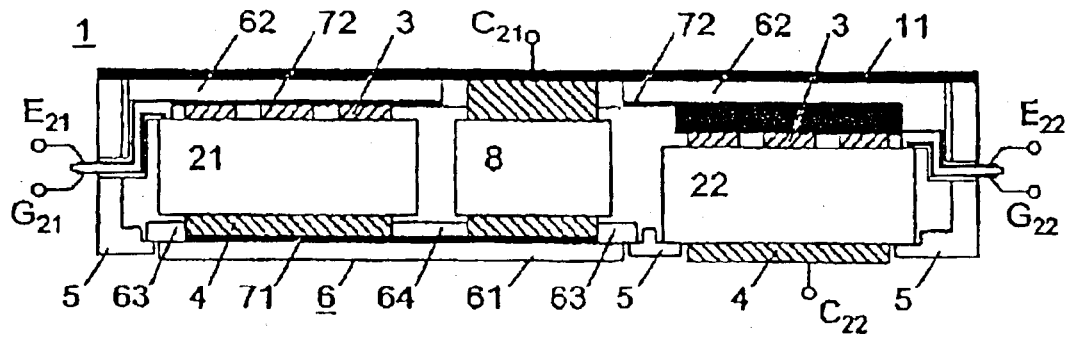
FIG. 3 shows a section through the power semiconductor module as shown in FIG. 2, with two submodules connected in series, back-to-back.

FIGS. 2 and 3 show two embodiments of the power semiconductor module according to the invention. The module has an electrically conductive covering panel 11, an electrically insulating housing 5 which is connected flush to the covering panel, and a number of submodules 21 and 22.

The covering panel 11 is manufactured from an electrically and thermally highly conductive metal, for example copper or aluminum. This forms the first main electrical connection $E_{21}$ of the module and, by way of example, is electrically connected, in a stack, to the main connection of a module located above it.

The housing 5 is manufactured from an electrically insulating material which can be loaded mechanically and thermally, for example epoxy. The housing has side wall regions which carry the majority of the contact force exerted on the module in a press pack stack, as well as a base region. The covering panel and the base region of the housing form two opposite, essentially parallel, main surfaces of the module. Openings SI are incorporated in the housing in the base region, through which a second main electrical connection of the module $C_{22}$ is passed out of the housing.

Figure 1:
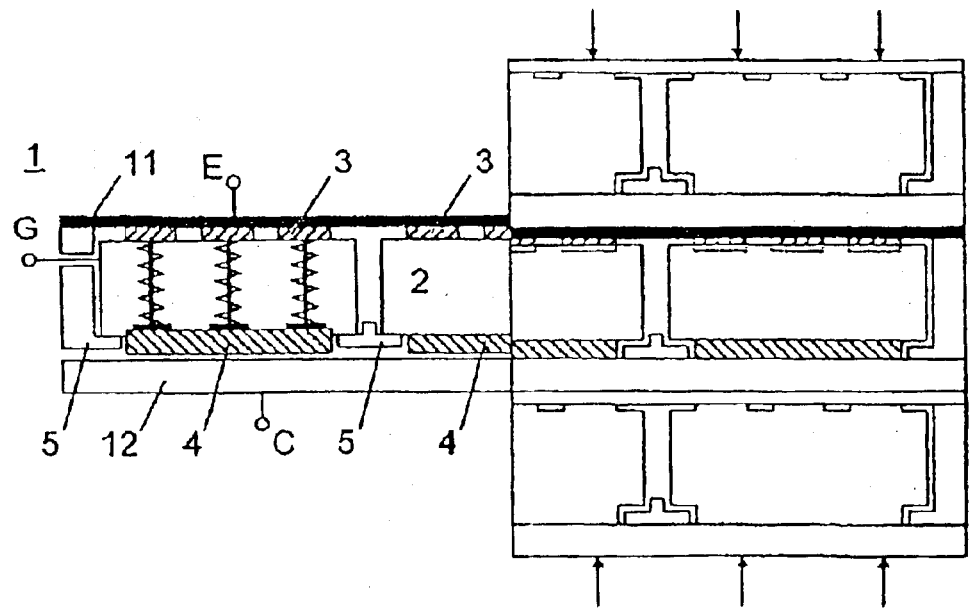
FIG. 1 shows a section through a power semiconductor module according to the prior art, in the preinstalled state (left-hand half of the figure) and in the installed state (right-hand half of the figure)

Two power semiconductor submodules 21 and 22, which are known per se, are arranged alongside one another in the interior of the module. As a rule, and as indicated in FIG. 1, the submodules have a number of semiconductor chips which are arranged with a first main electrode (anode, emitter) alongside one another on a base plate, and are electrically connected in parallel. Second main electrodes (cathode, collector) of the semiconductor chips are made contact with by contact dies. The contact dies are connected to a first main connection 3, and the base plate is connected to a second main connection 4. The main connections may be in the form of disks, and may be held together by means of flanges. The contact die has, by way of example, spring elements which press against the individual chips. Further connections (control/gate connections) of the semiconductor chips are passed out of the submodule at the side, or on one of the sides of the main connections 3 or 4, in order to make contact.

The two submodules are pressed in between the two main surfaces of the module, in particular between the covering panel 11 and a base plate, which is not illustrated but is passed to the module from underneath. The base plate, for example in the form of a cold plate through which a cooling liquid flows, is electrically and thermally highly conductive.

The module has connections which are passed out of the module housing at the side and, depending on the type of power semiconductors, are control connections $G_{21}$ and $G_{22}$ as well as connections $E_{21}$ and $C_{21}/E_{22}$, which are connected to corresponding main connections of the submodules.

In the first embodiment of the power semiconductor module according to the invention as shown in FIG. 2, the first main connection 3 of the first submodule 21 rests directly on the covering panel 11 of the module, and is electrically conductively connected to it. The second main connection 4 of the first submodule 21 rests on an insulating mounting panel 6, which essentially comprises a layer 61 of an electrically insulating and thermally highly conductive material. The insulating mounting panel advantageously has a ceramic substrate, with a ceramic layer surrounded by copper layers on both sides. The copper layers ensure good thermal contacts, and contribute to the robustness of the panel.

The first main connection 3 of the second submodule 22 likewise rests on the covering panel 11 of the module, but is electrically insulated from it by a layer 62 composed of an electrically insulating and thermally highly conductive material. The second main connection 4 of the second submodule 22 is arranged in one of the openings 51 in the base region of the housing 5 such that, when the module is fitted onto the base plate or cold plate, the second main connection 4 forms the second main connection of the module $C_{22}$ and, together with the insulating mounting panel 6, forms that main surface of the module which is opposite the covering panel 11.

The insulating mounting panel 6 and the second submodule 22 are arranged in the openings such that they can move. If the module is fitted on a base plate or cold plate and has a contact force applied to it in a corresponding manner, the insulating mounting panel 6 and the second submodule 22 are pressed into the interior of the module housing, and against the covering panel. The movement range is limited by the insulating housing, in particular the wall regions. Securing means are provided in the region of the openings, so that the insulating mounting panel 6 and the submodule 22 do not fall out of the module housing when the module is not arranged on the base plate or cold plate. For example, the securing means may be stops that are fitted to the housing and which appropriately restrict the freedom of movement of the insulating mounting panel and of the submodule.

Figure 4:
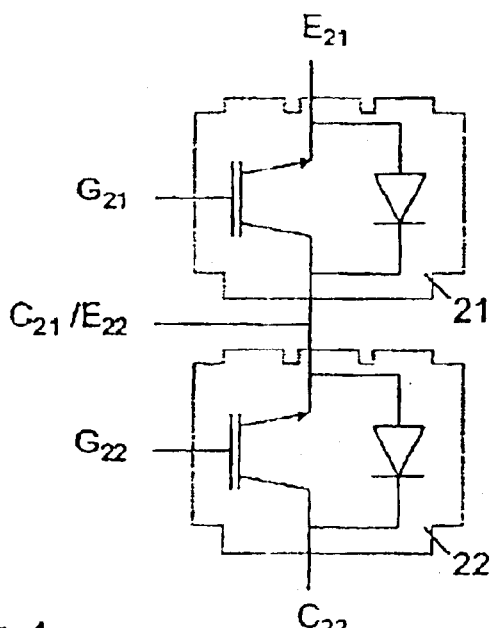
FIG. 4 shows a schematic of the power semiconductor module as shown in FIG. 2.

The two submodules of the first embodiment of the power semiconductor module according to the invention as illustrated in FIG. 2 are electrically connected to form a series circuit. The submodules are each fitted, by way of example, with one or more IGBTs and a parallel freewheeling diode, so that this results in the module having the circuit layout illustrated in FIG. 4.

The two main electrodes of the submodules, which are each separated from the adjacent main surface of the module by an insulating layer, namely the second main electrode 4 of the first submodule 21 and the first main electrode 3 of the second submodule 22, are electrically connected to one another.

A first electrically conductive connection layer 71 is arranged on the insulating mounting panel 6, between the insulating layer 71 and the second main connection 4 of the first submodule 21. By way of example, this is the copper layer, as mentioned above, on the ceramic substrate, or a further metal layer which is applied to this copper layer. The second main connection of the submodule 21 is either flush with the connection layer 71, for example by being soldered on or by means of a low temperature bond (LTB) connection, or is connected via a layer of thermally conductive paste and appropriate contact pressure.

On the opposite side, in the region of the first main connection 3 of the second submodule 22, a second electrically conductive connection layer 72 is arranged between the insulating layer 62 and the main connection 3 of the submodule.

The two connection layers 71 and 72 are electrically conductively connected to one another via a connection element 8. The connection element 8 is, by way of example, constructed analogously to the two submodules 21 and 22, and has a base plate as well as one or more contact dies with spring elements. This allows the connection element 8 to be compressed in the same way as the submodules between the corresponding contact surfaces. The connection element 8, which generally does not contain any electronic elements, may also be replaced by a conventional submodule with semiconductor chips or other electronic elements. The connection element 8 is arranged or mounted on the insulating mounting panel, in an analogous manner to the first submodule.

Projections 63 composed of electrically insulating material are provided in the edge region of the insulating mounting panel 6. Firstly, these interact with the stops on the housing parts 50 while, secondly, they prevent creepage currents or flashovers along the adjacent housing parts. Furthermore, together with the positioning elements 64 which are arranged between the first submodule 8 and the connection element 8, they ensure that the submodule 21 and the connection element 8 are positioned correctly with respect to the insulating mounting panel 6, and with respect to the rest of the module.

On the emitter side, that is to say in the region of the first main connections 3, control connections are fitted to the submodules 21 and 22. These are connected, in the interior of the submodules, to corresponding control electrodes of the semiconductor chips. These control connections $G_{21}$ and $G_{22}$, are passed out of the housing of the module by means of connecting leads, where, together with the emitter connection $E_{21}$ of the first submodule and the combined connection $C_{21}/E_{22}$, they can make contact with the collector connection of the first submodule and the emitter connection of the second submodule, which are likewise passed out of the housing using connecting leads.

In the switched-on state, the current flows from the second main connection of the module, to the collector connection $C_{22}$ of the second submodule 22, through the second submodule via the emitter connection $E_{22}$ of the second submodule, the second connection layer 72, the connection element 8, the first connection layer 71 and the collector connection $C_{21}$ of the first submodule 21, through the first submodule to the first main connection of the module, to the covering panel 11, and to the emitter connection $C_{21}$ of the first submodule.

In the switched-off state, half the blocking voltage is in each case dropped across each of the two submodules.

Figure 5:
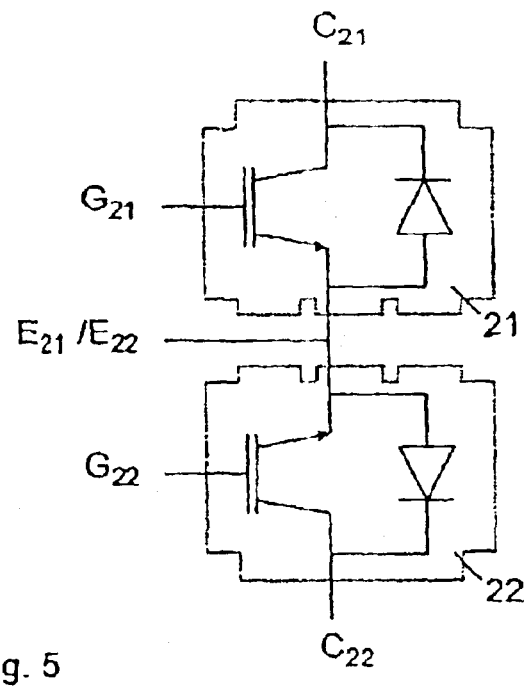
FIG. 5 shows a schematic of the power semiconductor module as shown in FIG. 3.

In the second embodiment of the power semiconductor module according to the invention and as shown in FIG. 3, the two submodules are electrically connected to form a back-to-back series circuit. This means that the first submodule 21 is connected via the second main connection 4 to the covering panel and to the first main connection of the module, and the first main connection 3 of the first submodule 3 is connected to the first main connection 3 of the second submodule 22. If fitted with an IGBT and a parallel freewheeling diode once again, this results in the module having the circuit layout illustrated in FIG. 5.

While the second submodule 22 is arranged and electrically connected in precisely the same way as in the first embodiment, the first submodule 21 in the second embodiment is admittedly arranged in the same way, but is electrically connected with the opposite polarity.

Although the first main connection 3 of the first submodule 21 once again rests on the covering panel 11 of the module, it is not, however, electrically conductively connected to it. An insulating layer 62 is arranged between the main connection of the submodule and the covering panel. This is the lengthened insulating layer 62, which is arranged between the second submodule 22 and the covering panel 11. The two first main connections 3 of the two submodules are electrically conductively connected to one another via the connection layer 72. The connection layer is in this case arranged between the main connections and the insulating layer 62.

The second main connection 4 of the first submodule 21 once again rests on the insulating mounting panel 6. The second main connection 4 of the first submodule is electrically connected to the covering panel 11 via the connection element 8 and the connection layer 61 which is arranged on the insulating mounting panel 6. In the illustrated, advantageous embodiment, the connection element 8 is passed to the covering panel 11 through a central opening in the insulating layer 62 and in the connection layer 72.

Since both the submodules 21 and 22 have the same physical height, the connection layer 72 has a thickness which is greater by the thickness of the insulating mounting panel 6, including any connection layer 71 arranged on it, in the region of the first main connection 3 of the second submodule 22 than in the region of the first main connection of the first submodule 21.

The collector-emitter current thus in each case flows from the two main connections of the modules $C_{21}$ and $C_{22}$ either through the connection element 8, via the connection layer 71 and the second main connection 4 of the first submodule 21 and through the first submodule 21 to the first main connection 3 of the first submodule 21 and to the emitter connection $E_{21}$, or through the second submodule 22 to the corresponding emitter connection $E_{22}$. The emitter connections $E_{21}$ and $E_{22}$, which are electrically conductively connected to one another by means of the connection layer 72, are passed out of the module housing in order to make external contact with them, together with the corresponding control connections $G_{21}$ and $C_{22}$, via connecting leads. Instead of the two emitter connections, it is also possible for only one of the emitter connections to be passed out of the housing.

In the illustrations shown in FIGS. 2 and 3, the two connections of the two submodules which are passed out of the housing are each arranged on opposite sides of the module. In one advantageous embodiment of the power semiconductor module according to the invention, all the connections are arranged on one side of the module, so that it is easier to make external contact with the module via these connections. For this purpose, the connecting leads are routed in an appropriate manner to one side in the interior of the module housing.

In a very particularly advantageous embodiment of the power semiconductor module according to the invention, the connecting leads are encapsulated together with the second connection layer 72 and the covering panel 11, using an electrically insulating material, to form a cover unit 10. The electrically insulating material is advantageously thermally highly conductive, is resistant to temperatures up to 160° C., is resistant to pressures up to 30 bar, is resistant to creepage, can be cast without any cavities and has a coefficient of expansion which is matched to that of copper. One material which combines these characteristics is, by way of example, epoxy. In order to produce the cover unit, the epoxy is either cast in an appropriate shape around the electrically conductive parts, or is applied by spraying.

Figure 6:
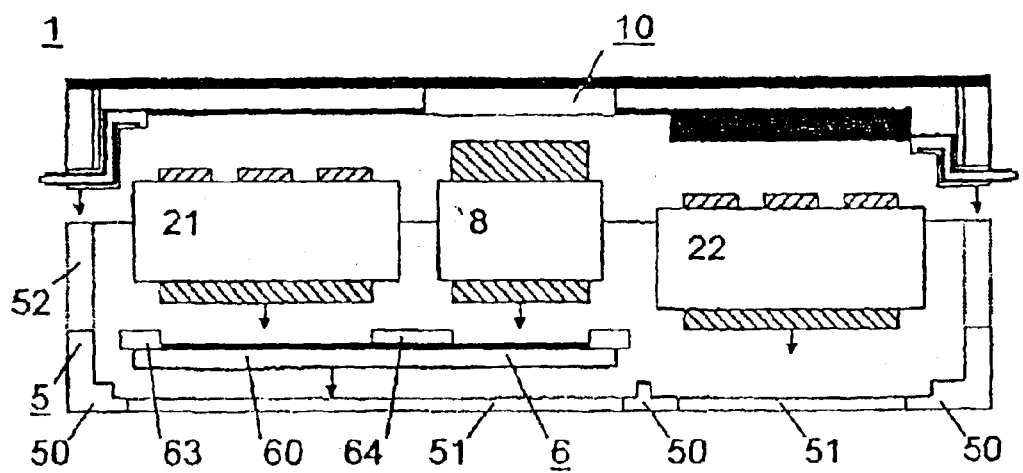
FIG. 6 shows a section through the power semiconductor module as shown in FIG. 3, during installation.

The illustration in FIG. 6 shows how the individual elements of the power semiconductor module according to the invention are assembled during installation.

In a first installation step, the insulating mounting panel 6 is inserted into the housing, which is provided with the openings 51. The insulating mounting panel 6 is held by stops on the housing parts 50 in the region of the openings 51. The insulating terminals 63 are fitted in the edge region on the insulating panel 6 and, as can be seen from the figure, interact with the corresponding stops on the housing parts 50.

In a subsequent installation step, the submodules 21 and 22 as well as the connection element 8 are passed into the housing. The first submodule 21 and the connection element 8 are mounted on the insulating mounting panel 8, while the second submodule 22 is inserted into the opening 51 provided for this purpose. The second submodule 22 is also prevented from falling out by means of appropriate stops on the housing parts 50. Positioning elements 64 are arranged on the insulating mounting panel 6, for accurate positioning of the first submodule 21 and of the connection element 8 on the insulating mounting panel 6. The insulating terminations 63 are likewise used for positioning.

Alternatively, the first submodule 21 and the connection element 8 are fitted on the insulating mounting panel 6, and, if need be, are mounted on it, before the insulating mounting panel is placed in the housing.

In a further installation step, the cover unit 10 is placed on the housing. The connection layers which are integrated in the cover unit and the connecting leads are joined to the corresponding contact connections of the submodules thanks to the accurate positioning of the submodules. The contact force on the housing cover ensures that the necessary contact force is applied to the press pack contact connections of the submodules. In order to improve the electrical and thermal junction, an appropriate thermally conductive paste can be applied between the press pack contact surfaces.

The series circuit, or back-to-back series circuit, of semiconductor chips which has been mentioned may also be achieved by appropriate reversal (inversion) of the submodules, or of the semiconductor chips which are arranged in the submodule. By way of example, the back-to-back series circuit corresponding to the circuit shown in FIG. 5 can be produced by means of an inverted first submodule (flip submodule) in the first embodiment as mentioned above. It is thus possible to produce both switches with an increased blocking voltage as well as the alternating-current switches mentioned above simply by reversing the corresponding submodule together with a housing.

For the purposes of the invention, the general term the series circuit also covers two components of opposite polarity connected in series (back-to-back series circuit).

List of Reference Symbols

1 Power semiconductor module
10 Cover unit
11 Covering panel
2, 21. 22 Submodule
3, 4 Main connections
5, 50 Insulating housings
51, 52 Openings
6 Insulating mounting panel
61, 62 Insulating layers
63 Insulating terminations
64 Positioning element
71, 72 Connection layers
8 Connection element
C, $C_{21}$, $C_{22}$ Collector connection
E, $E_{21}$, $E_{22}$ En Emitter connection
G, $G_{21}$, $G_{22}$ Gate connection

What is claimed is:

1. A power semiconductor module comprising:
a first main module electrical connection arranged on a first main surface of the module and a second main module electrical connection arranged on a second main surface of the module wherein the first and second main surfaces of the module are mutually opposite and essentially parallel, and wherein the first main module connection is in the form of an electrically conductive covering panel;

an electrically insulating housing which is connected to the covering panel and arranged between the two main module electrical connections;

first and second submodules, each submodule including first and second main submodule electrical connections arranged on mutually opposite and essentially parallel main surfaces of the submodule, at least one semiconductor chip having a first main electrode electrically conductively connected to the first main submodule electrical connection and a second main electrode electrically conductively connected to the second main submodule electrical connection; wherein the first and second submodules are arranged alongside one another;

the first and second submodules are pressed toward the covering panel by a contact force applied to the first and second submodules; and the first and submodules are electrically connected in series.

2. The power semiconductor module as claimed in claim 1, wherein the second main submodule electrical connection of the first submodule is electrically conductively connected to the first main submodule electrically connection of the second submodule via a first connection.

3. The power semiconductor module as claimed in claim 2, wherein the first main submodule electrical connection of the first submodule is electrically conductively connected to the covering panel;

a first electrically insulating layer is arranged between the second main submodule electrical connection of the first submodule and the second main surface of the module;

a second electrically insulating layer is arranged between the first main submodule electrical connection of the second submodule and the covering panel; and the second main submodule electrical connection of the second submodule is electrically conductively connected to the second main module electrically connection.

4. The power semiconductor module as claimed in claim 3, wherein the first connection comprises:

a first electrically conductive connection layer arranged between the second main submodule electrical connection of the first submodule and the first electrically insulating layer;

a second electrically conductive connection layer arranged between the first main submodule electrical connection of the second submodule and the second electrically insulating layer;

an electrically conductive connection element in electrical contact with the first electrically conductive connection layer and the second electrically conductive connection layer.

5. The power semiconductor module as claimed in claim 2, comprising:

a first electrically insulating layer arranged between the first main submodule electrical connection of the first submodule and the second main surface of the module; and a second electrically insulating layer arranged between the second main submodule electrical connection of the first submodule and the covering panel, as well as between the first main submodule electrical connection of the second submodule and the covering panel;

wherein the first main submodule electrical connection of the first submodule is electrically conductively connected to the covering panel via a second connection; and wherein the second main submodule electrical connection of the second submodule is electrically conductively connected to the second main module electrical connection.

6. The power semiconductor module as claimed in claim 5, wherein the second connection includes a first electrically conductive connection layer arranged between the first main submodule electrical connection of the first submodule and the first and electrically insulating layer;

the second connection includes a connection element electrically conductively connecting the first electrically conductive connection layer to the covering panel;

the first connection includes a second electrically conductive connection layer arranged between the second main submodule electrical connection of the first submodule and the second electrically insulating layer, as well as between the first main submodule electrical connection of the second submodule and the second electrically insulating layer.

7. The power semiconductor module as claimed in claim 6, wherein:

an opening is incorporated in the second electrically conductive connection layer and in the second electrically insulating layer; and the connection element connecting the first electrically conductive connection layer to the covering panel passes through the opening.

8. The power semiconductor module as claimed in claim 6, wherein:

the second electrically conductive connection layer has a greater thickness in a region between the first main submodule electrical connection of the second submodule and the second electrically insulating layer than in a region between the second main submodule electrical connection of the first submodule and the second electrically insulating layer.

9. The power semiconductor module as claimed in claim 3, wherein:

the first electrically insulating layer is part of an insulating mounting panel;

at least one opening is incorporated in the electrically insulating housing in a region of the second main surface of the module; and the insulating mounting panel is arranged in the at least one opening.

10. The power semiconductor module as claimed in claim 9, wherein the insulating mounting panel can move at right angles to the covering panel.

11. The power semiconductor module as claimed in claim 10, comprising:

means for limiting a movement range of the insulating mounting panel, arranged in the a region of the opening.

12. The power semiconductor module as claimed in claim 1, wherein the main submodule electrical connections and/or further connections of the submodules are passed out of the electrically insulating housing in order to make contact with connecting leads.

13. The power semiconductor module as claimed in claim 12, wherein the covering panel, the connecting leads, insulating layers that are arranged between the submodule and the covering panel, and connection layers that are arranged between the submodule and the covering panel are in the form of a cover unit.

14. The power semiconductor module as claimed in claim 13, wherein the covering panel, the connecting leads and the connection layers that are arranged between the submodule and the covering panel are encapsulated with an electrically insulating material.

15. The power semiconductor module of claim 8, wherein the second electrically conductive connection layer is thicker in the region between the first main submodule electrical connection of the second submodule and the second electrically insulating layer than in the region between the second main submodule electrical connection of the first submodule and the second electrically insulating layer, by a sum of a thickness of the first electrically insulating layer and a thickness of the first electrically conductive connection layer.

16. The power semiconductor module of claim 11, wherein the means for limiting comprises stops arranged on the housing and/or on the first electrically insulating layer.

17. The power semiconductor of claim 13, wherein the cover unit is prefabricated.

* * * * *